United States Patent [19]

Kondou

[11] Patent Number: 5,359,567
[45] Date of Patent: Oct. 25, 1994

[54] SEMICONDUCTOR MEMORY DEVICE

[75] Inventor: Kenji Kondou, Tokyo, Japan

[73] Assignee: NEC Corporation, Tokyo, Japan

[21] Appl. No.: 87,898

[22] Filed: Jul. 9, 1993

[30] Foreign Application Priority Data

Jul. 9, 1992 [JP] Japan .................................. 4-181991

[51] Int. Cl.$^5$ .......................................... G11C 11/413
[52] U.S. Cl. .................................... 365/207; 365/208;
365/204; 365/202; 365/190; 365/189.01
[58] Field of Search ............... 365/207, 205, 208, 204,
365/202, 196, 190, 189.01, 189.05

[56] References Cited

U.S. PATENT DOCUMENTS

| 4,931,994 | 6/1990 | Matsui et al. | 365/207 |
| 5,239,507 | 8/1993 | Ohba | 365/207 |

Primary Examiner—Viet Q. Nguyen
Attorney, Agent, or Firm—Sughrue, Mion, Zinn, Macpeak & Seas

[57] ABSTRACT

A semiconductor memory device for controlling active and inactive conditions of differential amplifier circuits by a pair of complementary signals produced on the basis of write data input to an external input terminal to reduce a drive load of an output signal of a control circuit for selecting a writing or reading operation of the semiconductor memory device to achieve a quick writing operation.

4 Claims, 6 Drawing Sheets

SEMICONDUCTOR MEMORY DEVICE

BACKGROUND OF THE INVENTION

The present invention relates to a semiconductor memory device, and more particularly to a semiconductor memory device in which an activation of differential amplifier circuits is controlled by a pair of complementary signals produced on the basis of write data input to the semiconductor memory device.

DESCRIPTION OF THE RELATED ARTS

Figure 1:
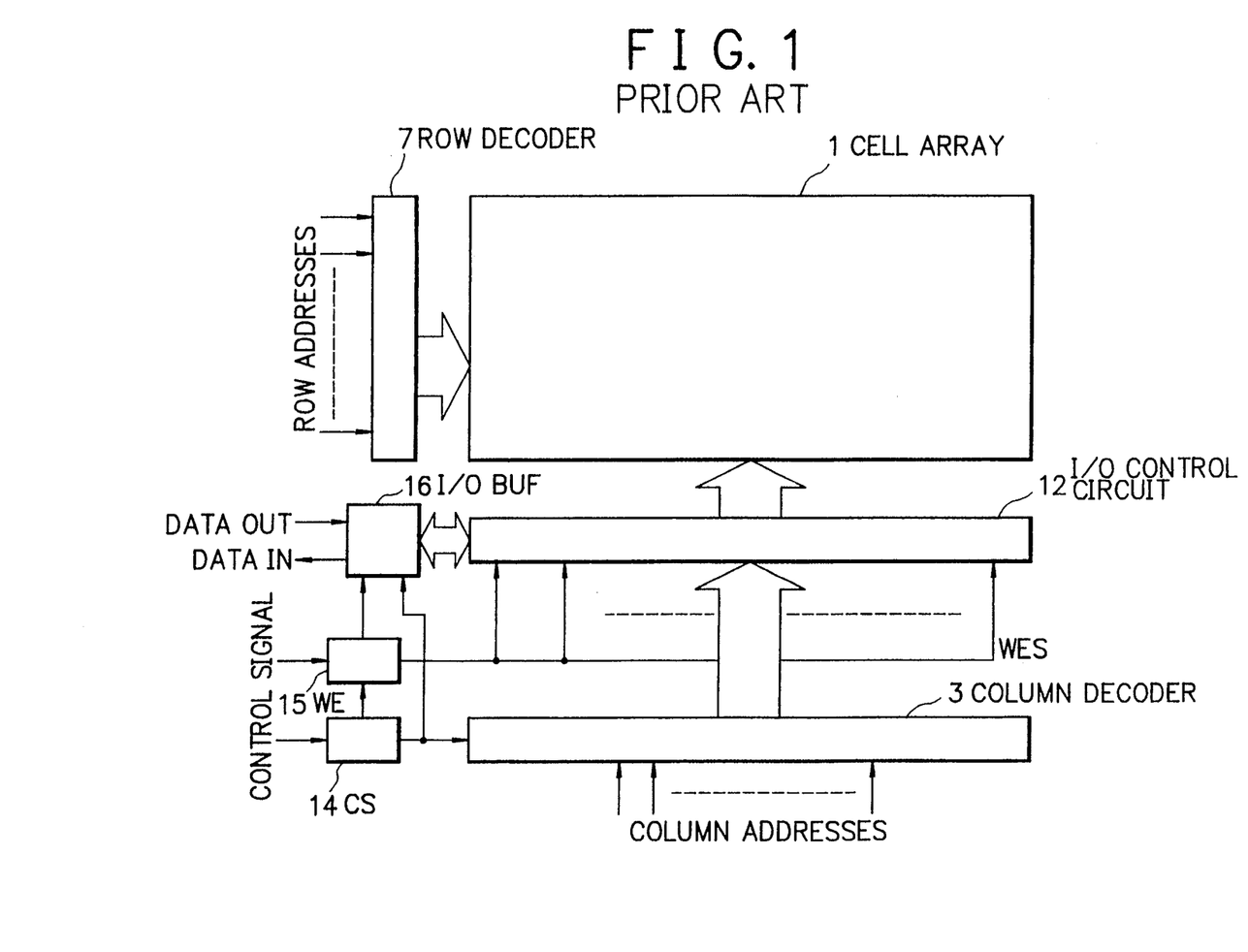
FIG. 1 is a schematic block diagram of a conventional semiconductor memory device.

FIG. 1 shows a conventional semiconductor memory device which is comprised of a cell array 1, a column decoder 3 having column addresses, coupled with the cell array 1 via an I/O (input/output) control circuit 12, a row decoder 7 having row addresses, connected to the cell array 1, a chip enable control circuit (CS) 14, a control circuit (WE) 15 for selecting a writing or reading operation, and an input/output (I/O BUF) circuit 16 coupled with the I/O control circuit 12. Data are input and output to and from the I/O circuit 16, and a control signal is supplied to the chip enable control circuit 14 and the control circuit 15.

Figure 2:
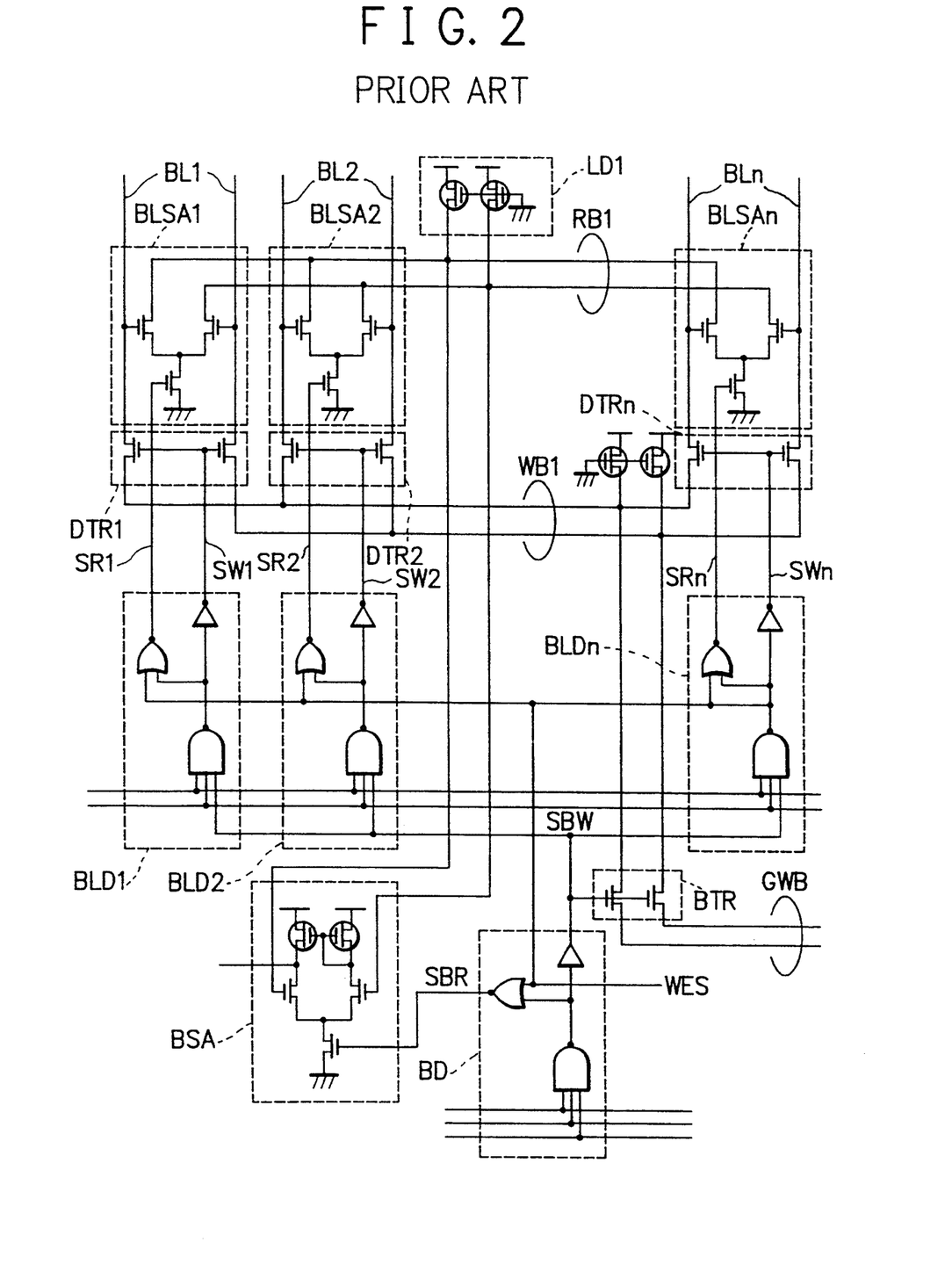
FIG. 2 is a circuit diagram showing an I/O circuit connected to bit line pairs and a decoder circuit for selecting the same in the conventional semiconductor memory device shown in FIG. 1.

FIG. 2 illustrates an I/O circuit connected to bit line pairs and a decoder circuit for selecting the bit line pairs in the conventional semiconductor memory device, which include bit line pairs BL1, BL2, . . . and BLn, differential amplifier circuits BLSA1, BLSA2, . . . and BLSAn which are connected with the corresponding bit line pairs BL1, BL2, . . . and BLn and have a common output signal line pair RB1 and a common load circuit LD1, first selection signal lines SR1, SR2, . . . and SRn of the differential amplifier circuits BLSA1, BLSA2, . . . and BLSAn, transfer gates DTR1, DTR2, . . . and DTRn for transferring write data to the corresponding bit line pairs BL1, BL2, . . . and BLn, a write data line pair WB1 connected to the transfer gates DTR1, DTR2, . . . and DTRn, second selection signal lines SW1, SW2, . . . and SWn of the transfer gates DTR1, DTR2, . . . and DTRn, decoder circuits BLD1, BLD2, . . . and BLDn for selecting the bit line pairs BL1, BL2, . . . and BLn, a global write data line pair GWB, a transfer gate circuit BTR for connecting the write data line pair WB1 with the global write data line pair GWB, a differential amplifier circuit BSA, a third selection signal line SBW of the decoder circuits BLD1, BLD2, . . . and BLDn and the transfer gate circuit BTR, a fourth selection signal line SBR of the differential amplifier circuit BSA, an output signal line WES of the control circuit 15 in the semiconductor memory device, and a decoder circuit BD for selecting a plurality of divided memory cell blocks including all the above-described circuits within the semiconductor memory device.

Next, the operation of the above-described system shown in FIG. 2 in the conventional semiconductor memory device will now be described.

The decoder circuit BD for selecting the memory cell blocks receives decode signals of address signals input to the semiconductor memory device to produce a selection signal SBW of the decoder circuits BLD1, BLD2, . . . and BLDn and the transfer gate circuit BTR and also carries out a logic of the decode signals of the address signals and an output signal WES of the control circuit 15 for selecting the writing or reading operation of the semiconductor memory device to produce a selection signal SBR. The decoder circuits BLD1, BLD2, . . . and BLDn receive the decode signals of the address signals input to the semiconductor memory device and the selection signal SBW to produce selection signals SW1, SW2, . . . and SWn of the transfer gates DTR1, DTR2, . . . and DTRn for transferring the write data to the corresponding bit line pairs and execute the logic of the decode signals of the address signals, the selection signal SBW and the output signal WES of the control circuit 15 for selecting the writing or reading operation of the semiconductor memory device to produce selection signals SR1, SR2, . . . and SRn.

Now, when the semiconductor memory device including the circuit shown in FIG. 2 is in the writing operation mode and one bit line pair BL1 of the memory cell blocks shown in FIG. 2 and the bit line pairs BL1, BL2, . . . and BLn included therein is selected by the decoder circuit BD, the selection signal SBW and the selection signal SW1 become a "High" potential and the transfer gate circuit BTR and the transfer gate DTR1 are turned "ON". Hence, the global write data line pair GWB, the write data line pair WB1 and the bit line pair BL1 are electrically connected and the write data input to the semiconductor memory device are transferred to the write data line pair WB1 via the global write data line pair GWB and are then transferred to the bit line pair BL1. Also, since the semiconductor memory device is in the writing operation mode, the output signal WES becomes the "High" potential and the selection signal SBR and the selection signal SR1 becomes a "Low" potential. Hence, the differential amplifier circuits BLSA1 and BSA are not selected to reduce consumption power.

In the I/O circuit connected to the bit line pairs and the decoder circuit for selecting the same of the conventional semiconductor memory device, the signal line for selecting the differential amplifier circuits provided corresponding to the bit line pairs and the transfer gates for transferring the write data to the corresponding bit line pairs is separated into the first selection signal lines SR1, SR2, . . . SRn and the second selection signal lines SW1, SW2, . . . and SWn, as shown in FIG. 2. In order to reduce the power consumption by not selecting the differential amplifier circuit in the writing operation, each decoder circuits BLD1, BLD2, . . . or BLDn for selecting the corresponding bit line pair must include a decoder circuit for producing the selection signal SW1, SW2, . . . or SWn and another decoder circuit for producing the selection signal SR1, SR2, . . . or SRn. Hence, an occupation area of the decoder circuits for selecting the corresponding bit line pairs in the semiconductor memory device is increased and a driving load of the output signal line of the control circuit for selecting the writing or reading operation is also increased.

SUMMARY OF THE INVENTION

It is therefore an object of the present invention to provide a semiconductor memory device in view of the aforementioned problems of the prior art, which is capable of reducing a drive load of an output signal of a control circuit for selecting a writing or reading operation of the semiconductor memory device to realize a high speed operation.

In accordance with one aspect of the present invention, there is provided a semiconductor memory device, comprising a plurality of memory cells arranged in row and column directions; a memory cell array having bit line pairs connected to the corresponding columns of the memory cells and word lines connected to the corresponding rows of the memory cells: differential amplifier circuits for amplifying minute output data of the bit line pairs; transfer gates provided corresponding to the bit line pairs for transferring write data to the bit line pairs: a circuit to be connected to the transfer gates for producing a pair of complementary signals on the basis of write data input from an external part; a control circuit for selecting a writing or reading operation of the semiconductor memory device; and means for controlling active and inactive conditions of the differential amplifier circuits by the pair of complementary signals produced on the basis of the write data.

The differential amplifier circuits possess a common load circuit. The common load circuit is composed of P-channel insulated gate field effect transistors and is controlled by a first output signal produced by the controlling means. Alternatively, the common load circuit is composed of N-channel insulated gate field effect transistors and is controlled by a second output signal produced by the controlling means, the second signal having an antiphase with respect to the first output signal.

BRIEF DESCRIPTION OF THE DRAWINGS

The objects, features and advantages of the present invention will become more apparent from the consideration of the following detailed description taken in conjunction with the accompanying drawings in which.

DESCRIPTION OF THE PREFERRED EMBODIMENTS

Figure 3:
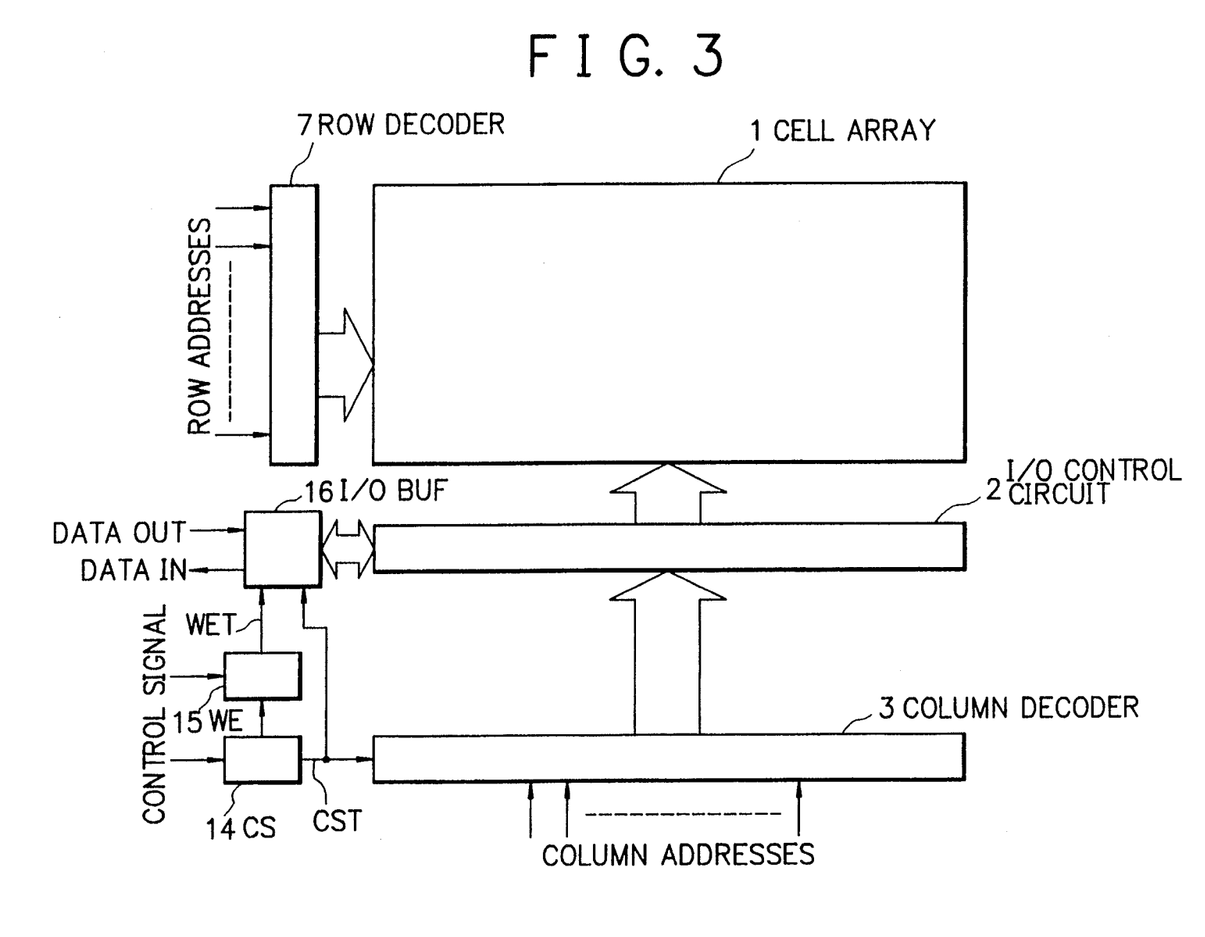
FIG. 3 is a schematic block diagram of a semiconductor memory device according to the present invention.

Referring now to the accompanying drawings, wherein like reference characters designate like or corresponding parts throughout the views and thus the repeated description thereof can be omitted for brevity, there is shown in FIG. 8 semiconductor memory device according to the present invention.

As shown in FIG. 3, the semiconductor memory device is comprised of a cell array 1, a column decoder 3 having column addresses, coupled with the cell array 1 via an I/O (input/output) control circuit 2, a row decoder 7 having row addresses, connected to the cell array 1, a chip enable control circuit (CS) 4, a control circuit (WE) 5 for selecting a writing or reading operation, and an input/output (I/O BUF) circuit 6 coupled with the I/O control circuit 2. Data are input and output to and from the input circuit 6, and a control signal is supplied to the chip enable control circuit 4 and the control circuit 5. The chip enable control circuit 4 outputs a signal CST to the column decoder 3 and the I/O circuit 6, and the control circuit 5 outputs a signal WET to the input circuit 6.

Figure 4:
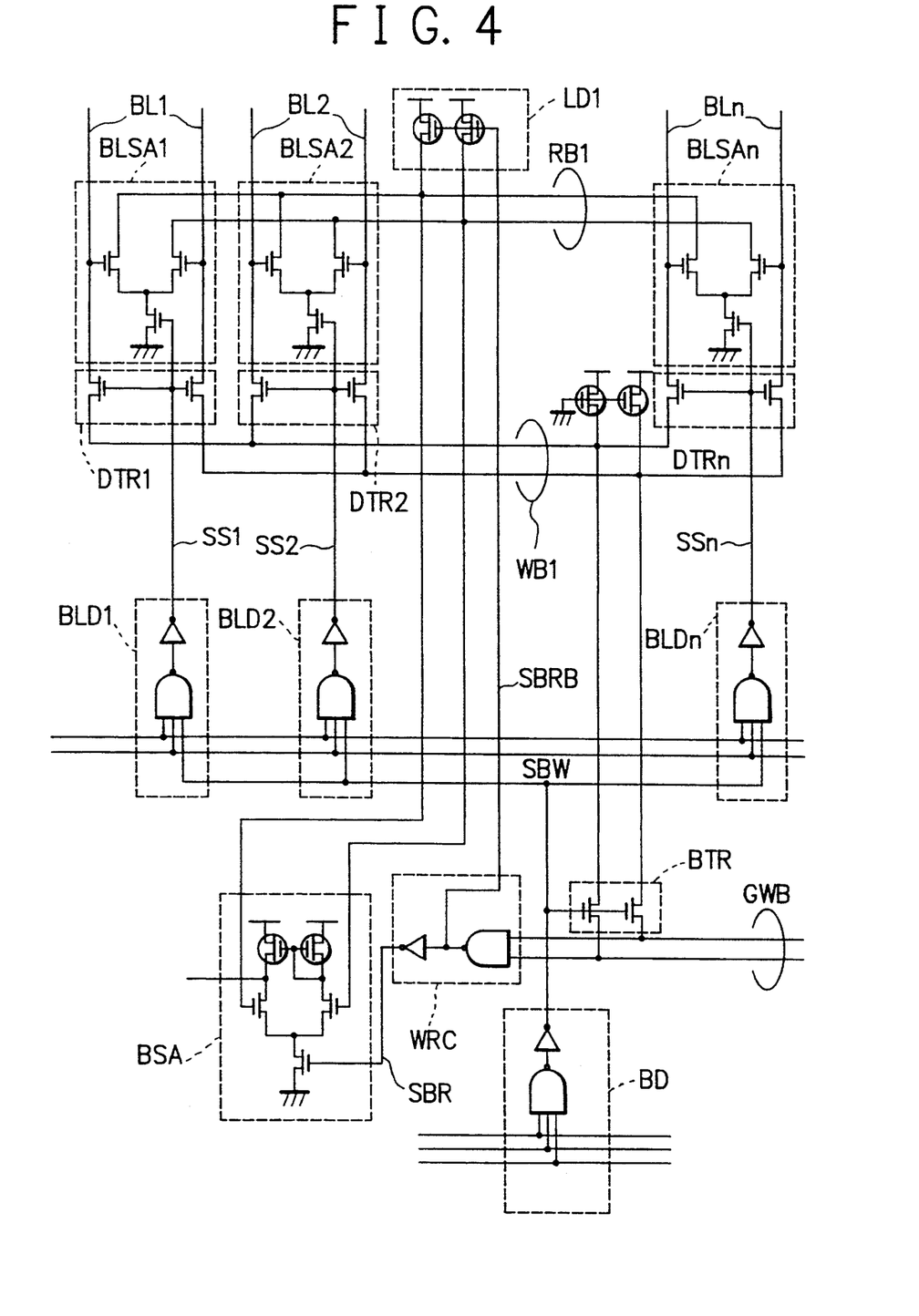
FIG. 4 is a circuit diagram showing an I/O circuit connected to bit line pairs and a decoder circuit for selecting the same in a first embodiment of a semiconductor memory device according to the present invention.

FIG. 4 illustrates an I/O circuit connected to bit line pairs and a decoder circuit for selecting the bit line pairs in a first embodiment of a semiconductor memory device according to the present invention, which include bit line pairs BL1, BL2, . . . and BLn, differential amplifier circuits BLSA1, BLSA2, . . . and BLSAn which are connected with the corresponding bit line pairs BL1, BL2, . . . and BLn and have a common output signal line pair RB1 and a common load circuit LD1 composed of P-channel insulated gate field effect transistors, transfer gates DTR1, DTR2, . . . and DTRn for transferring write data to the corresponding bit line pairs BL1, BL2, . . . and BLn, a write data line pair WB1 connected to the transfer gates DTR1, DTR2, . . . and DTRn, selection signal lines SS1, SS2, . . . and SSn of the differential amplifier circuits BLSA1, BLSA2, . . . and BLSAn and the transfer gates DTR1, DTR2, . . . and DTRn, decoder circuits BLD1, BLD2, . . . and BLDn for selecting the bit line paris BL1, BL2, . . . and BLn, a global write data line pair GWB, a transfer gate circuit BTR for connecting the write data line pair WB1 with the global write data line pair GWB, a differential amplifier circuit BSA, a third selection signal line SBW of the decoder circuits BLD1, BLD2, . . . and BLDn and the transfer gate circuit BTR, a fourth selection signal line SBR of the differential amplifier circuit BSA, a discrimination circuit WRC for discriminating the writing or reading operation of the semiconductor memory device depending on the state of the global write data line pair GWB, and a decoder circuit BD for slecting a plurality of divided memory cell blocks including all the above-described circuits within the semiconductor memory device.

Figure 5:
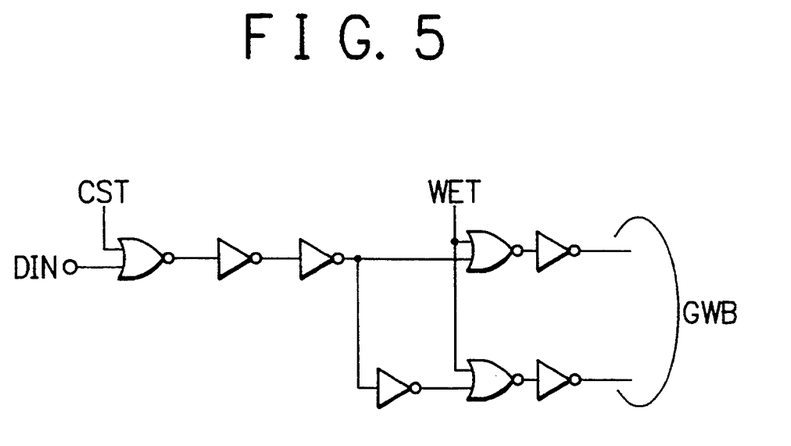
FIG. 5 is an input logic circuit of a part of an I/O circuit of a usual semiconductor memory device.

FIG. 5 shows an input logic circuit of a part of an I/O circuit of a usual semiconductor memory device. In FIG. 5, DIN is an external input terminal and GWB is a global write data line pair for outputting a pair of complementary signals on the basis of write data input to the external input terminal DIN.

Next, the operation of the above-described first embodiment of the semiconductor memory device according to the present invention will now be described.

The decoder circuit BD for selecting the memory cell blocks receives decode signals of address signals input to the semiconductor memory device to produce a selection signal SBW of the decoder circuits. BLD1, BLD2, . . . and BLDn and the transfer gate circuit BTR. The decoder circuits BLD1, BLD2, . . . and BLDn receive the decode signals of the address signals input to the semiconductor memory device and the selection signal SBW to produce selection signals SS1, SS2, . . . and SSn of the transfer gates DTR1, DTR2, . . . and DTRn for transferring the write data to the corresponding bit line pairs and the differential amplifier circuits BLSA1, BLSA2, . . . and BLSAn proviced corresponding to the bit line pairs.

Now, when the semiconductor memory device including the circuits shown in FIGS. 4 and 5 is in the writing operation mode and one bit line pair BL1 of the memory cell blocks shown in FIG. 4 and the bit line pairs BL1, BL2, . . . and BLn included therein is selected by the decoder circuit BD and the write data are input to the external input terminal DIN, because of the writing operation mode, an output signal WET of the control circuit for selecting the writing or reading operation becomes a "Low" potential and the complementary signals are output from the global write data line pair GWB depending on the write data input to the external input terminal DIN. Further, the selection signal SBW and the selection signal SS1 become a "High" potential and the transfer gate circuit BTR and the transfer gate DTR1 are turned "ON". Hence, the global write data line pair GWB, the write data line pair WB1 and the bit line pair BL1 are electrically connected and the write data input to the semiconductor memory device are transferred to the write data line pair WB1 via the global write data line pair GWB and are then transferred to the bit line pair BL1. Also, since the semiconductor memory device is in the writing operation mode, one of the global write data line pair GWB becomes the "High" or "Low" potential and another of the same becomes the "Low" or "High" potential. Thus, one output signal SBRB of the discrimination circuit WRC becomes the "High" potential and another output signal SBR of the same becomes the "Low" potential. Hence, the differential amplifier circuit BSA is not selected to reduce consumption power. At the same time, since the output signal SBRB for controlling the common load circuit LD1 of the differential amplifier circuits BLSA1, BLSA2, . . . and BLSAn becomes the "High" potential, the common load circuit LD1 is turned "OFF" and the differential amplifier circuits BLSA1, BLSA2, . . . and BLSAn having the common output signal line pair RB1 and the common load circuit LD1 are not selected to reduce the consumption power.

On the other hand, in the reading operation mode, as an output signal WET in FIG. 5 becomes "High" potential, a pair of the write data line GWB also become "High" potential. An output of the discrimination circuit WRC becomes "High" potential, and the differential amplifier circuit BSA is activated. Moreover, as a NAND gate in the discrimination circuit WRC outputs a "Low" potential output, P-channel insulated gate field effect transistors in the common load circuit LD1 are turned "ON". The global write data line pair GWB and the write data line pair WB1 are both "High" potential, the transfer gate BTR becomes "OFF".

On the other hand, by a read-out address, word lines (not shown) is selected. A store data of the memory cells connected with the selected word lines appear as the potential difference between the bit line pairs BL1, BL2, . . . and BLn.

Assuming now that when the output SS1 of the decoder BLD1 becomes active "High" potential by a read-out address, active "High" potential appears also at the gate of the transfer gate DTR1, the pair of the write data line WB1 are "High" potential, however, the bit line pair BL1 are connected with $V_{cc}$ via a common load circuit (not shown: the same structure as LD1), therefore, the "High" potential of the write data line pair WB1 do not give any substantial influence to the potential difference depending on the store data appeared on the bit line pair BL1.

The potential difference above is amplified by the differential amplifier BLSA1 and appeared on the common load circuit LD1, then after further amplified by the differential amplifier BSA, obtained as a read-out data.

Next, the second embodiment of the semiconductor memory device according to the present invention will now be described in connection with FIG. 6.

Figure 6:
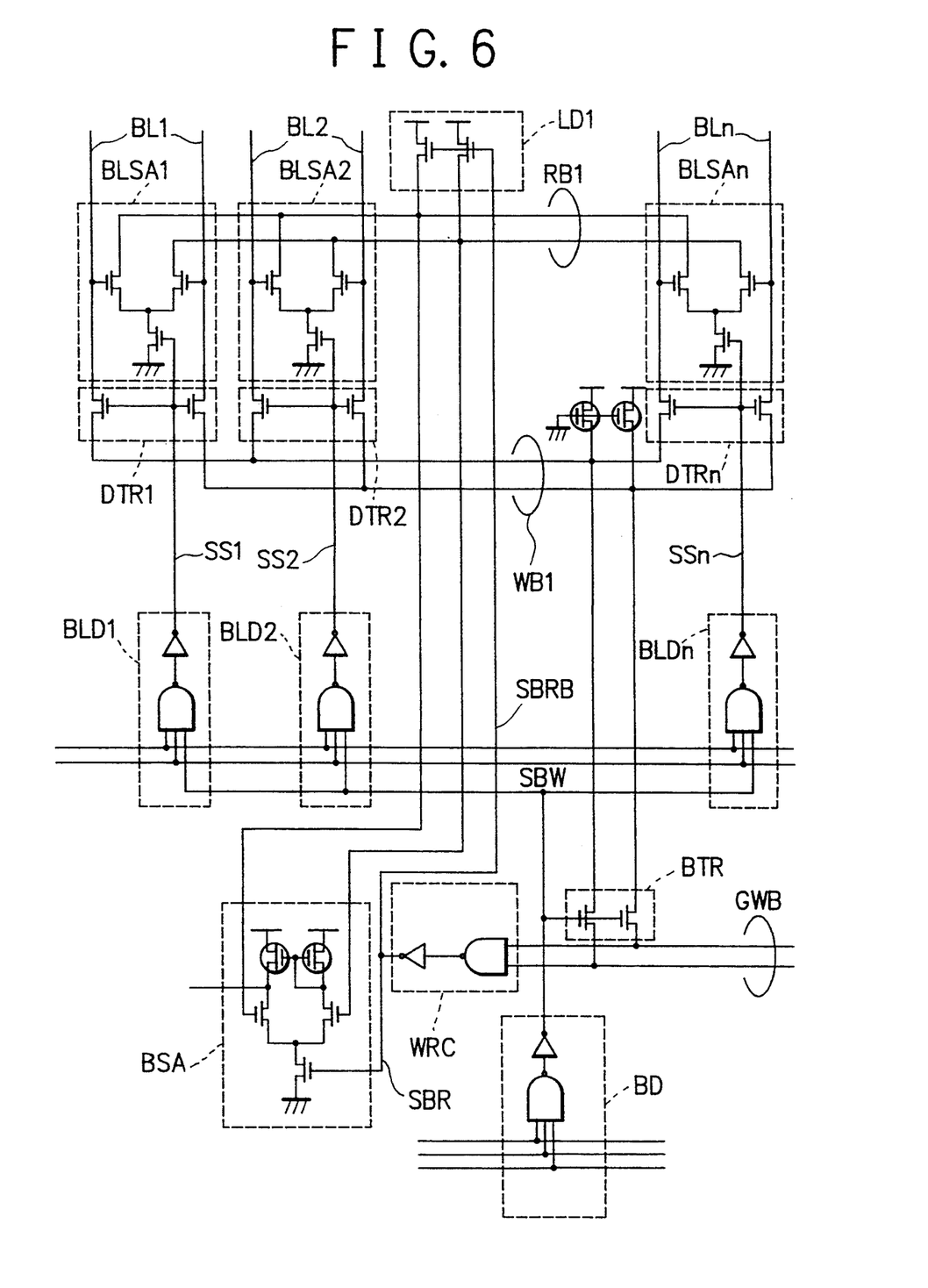
FIG. 6 is a circuit diagram showing an I/O circuit connected to bit line pairs and a decoder circuit for selecting the same in a second embodiment of a semiconductor memory device according to the present invention.

FIG. 6 shows an I/O circuit connected to bit line pairs and a decoder circuit for selecting the bit line pairs in a second embodiment of a semiconductor memory device according to the present invention, having the same construction as the first embodiment shown in FIG. 4, except that a common load circuit LD1 is composed of N-channel insulated gate field effect transistors and is controlled by the output signal SBR having an antiphase with respect to the output signal SBRB. In this embodiment, the opeeration is executed in the same manner as the first embodiment and thus the detailed description thereof can be omitted for brevity.

As described above, according to the present invention, the semiconductor memory device is provided with the discrimination circuit WRC for discriminating the writing or reading operation of the semiconductor memory device depending on the state of the global write data line pair GWB from which a pair of complementary signals are output on the basis of the write data input to the external input terminal, and by using the output signals of the discrimination circuit WRC, the active and inactive conditions of the differential amplifier circuits are controlled to reduce the drive load of the output signal of the control circuit for selecting the writing or reading operation of the semiconductor memory device and to realize the quick operation of the circuit.

While the present invention has been described with reference to the particular illustrative embodiment, it is not to be restricted by those embodiment but only by the appended claims. It is to be appreciated that those skilled in the art can change or modify the embodiment without departing from the scope and spirit of the present invention.

What is claimed is:

1. A semiconductor memory device, comprising:
a memory cell array having a plurality of memory cells arranged in row and column directions, a plurality of pairs of bit lines connected to the corresponding columns of the memory cells and a plurality of word lines connected to the corresponding rows of the memory cells;
a plurality of first differential amplifier circuits provided for corresponding ones of said pairs of bit lines;
a plurality of pairs of transfer gates provided for corresponding ones of Said pairs of bit line pairs for transferring when activated, true and complementary signals indicative of write data to said pairs of bit lines;
a second differential amplifier circuit receiving and amplifying an output derived from a selected one of the first differential amplifier circuits; and
a discriminating circuit for distinguishing between a writing condition and a reading condition of said semiconductor memory device by the write data, said discriminating circuit deactivating said second differential amplifier circuit when said discriminating circuit receives a pair of active and inactive signals indicative of write data, which shows the writing condition of said semiconductor memory device; said discriminating circuit activating said second differential amplifier circuit when said discriminating circuit receives a pair of active signals indicative of the write data, which shows the reading condition of said semiconductor memory device.

2. The semiconductor memory device as claimed in claim 1, wherein the first differential amplifier circuits contain a common load circuit.

3. The semiconductor memory device as claimed in claim 2, wherein the common load circuit is composed of insulated gate field effect transistors which are turned OFF when the second differential amplifier circuit is deactivated.

4. The semiconductor memory device as claimed in claim 2, wherein one of the first differential amplifier circuits and one of the pairs of transfer gates are activated simultaneously by a set of address signals.

* * * * *

UNITED STATES PATENT AND TRADEMARK OFFICE
CERTIFICATE OF CORRECTION

PATENT NO. : 5,359,567
DATED : October 25, 1994
INVENTOR(S) : Kondou

It is certified that error appears in the above-indentified patent and that said Letters Patent is hereby corrected as shown below:

Column 3, line 58, change "8" to --3--.

Col. 4, line 41, after "circuit" insert --16--.

Column 6, line 50, change "Said" to --said--.

Signed and Sealed this

Tenth Day of January, 1995

*Attest:*

BRUCE LEHMAN

*Attesting Officer*   *Commissioner of Patents and Trademarks*